US006750668B1

(12) United States Patent
Johnson

(10) Patent No.: US 6,750,668 B1
(45) Date of Patent: Jun. 15, 2004

(54) VORTEX UNIT FOR PROVIDING A DESIRED ENVIRONMENT FOR A SEMICONDUCTOR PROCESS

(75) Inventor: Brad Johnson, Brighton, CO (US)

(73) Assignee: LSI Logic Corporation, Milpitas, CA (US)

( * ) Notice: Subject to any disclaimer, the term of this patent is extended or adjusted under 35 U.S.C. 154(b) by 225 days.

(21) Appl. No.: 09/981,200

(22) Filed: Oct. 17, 2001

(51) Int. Cl.⁷ .................. G01R 31/02; G01R 31/26
(52) U.S. Cl. .................................. 324/760; 324/765
(58) Field of Search .......................... 324/754, 755, 324/757, 758, 765, 760; 62/5

(56) References Cited

U.S. PATENT DOCUMENTS 3,019,621 A * 2/1962 Lawson ..................... 62/467
3,173,273 A * 3/1965 Fulton ........................ 62/5
4,848,090 A * 7/1989 Peters ......................... 62/3.3
6,249,132 B1 * 6/2001 Amemiya ................. 324/760

* cited by examiner

Primary Examiner—David A. Zarneke
Assistant Examiner—Russell M Kobert
(74) Attorney, Agent, or Firm—Suiter West PC LLO

(57) ABSTRACT

A vortex unit suitable for providing a desired environment for a semiconductor process may include a vortex tube and a semiconductor processing device suitable for performing a semiconductor processing function. The vortex tube includes an air inlet for receiving compressed air, a first air exhaust for outputting an air stream having a temperature greater than the received compressed air, and a second air exhaust for outputting an air stream having a temperature lower than the received compressed air. The semiconductor processing device is connected to the second air exhaust of the vortex tube so that the semiconductor processing device receives a cooled air stream from the vortex tube, the cooled air stream providing an environment suitable for enabling the semiconductor processing device to perform the semiconductor processing function.

22 Claims, 2 Drawing Sheets

VORTEX UNIT FOR PROVIDING A DESIRED ENVIRONMENT FOR A SEMICONDUCTOR PROCESS

FIELD OF THE INVENTION

The present invention generally relates to the field of semiconductor manufacture and testing, and particularly to a vortex unit for providing desired environmental conditions in manufacture and/or testing of semiconductor devices.

BACKGROUND OF THE INVENTION

The manufacture and testing of semiconductor devices is a laborious process. Because of the complexity of the process, a high failure rate may be encountered during the manufacture of the devices. Thus, the devices must be tested extensively to ensure operation within desired parameters. Additionally, testing of the semiconductor device may require not only the testing of the ability of the semiconductor to perform desired operations, but also the ability of the semiconductor to perform the operations in contemplated environmental conditions.

Semiconductor devices may encounter a wide range of environmental conditions. From extreme heat to cold, and every temperature in between, users desire the operation of the semiconductor within desired parameters for the contemplated environmental conditions. Therefore, it may also be desirable to test the semiconductor devices within the contemplated operational temperature range to ensure the robustness of the device.

For example, previous methods used to test a semiconductor device may involve a liquid cooled temperature controller for cooling the environment of a desired process, such as testing of a device. However, liquid cooled units are expensive, units may cost several tens of thousands of dollars each, may utilize environmentally undesirable CFC, and are large in size. Thus, the unit may require a large space in a manufacturing facility and may be expensive to maintain, due to a large quantity of complex parts. Further, the units may generate electromagnetic interference with the testing equipment, thereby requiring extensive shielding to ensure accurate test results.

SUMMARY OF THE INVENTION

Accordingly, the present invention is directed to a vortex unit for providing a desired environment in a semiconductor manufacturing and/or testing process. By utilizing the present invention, a desired environment for the testing and/or manufacture of a semiconductor device may be provided in an efficient and cost-effective manner without encountering electromagnetic interference that limited the implementation of previous environmental systems.

In a first aspect of the present invention, a vortex unit suitable for providing a desired environmental condition for a semiconductor process includes a vortex tube and a semiconductor processing device suitable for performing a semiconductor processing function. The vortex tube includes an air inlet for receiving compressed air, a first air exhaust for outputting an air stream having a temperature greater than the received compressed air, and a second air exhaust for outputting an air stream having a temperature lower than the received compressed air. The semiconductor processing device is connected to the second air exhaust of the vortex tube so that the semiconductor processing device receives a cooled air stream from the vortex tube, the cooled air stream providing an environment suitable for enabling the semiconductor processing device to perform the semiconductor processing function.

In a second aspect of the present invention, a vortex unit suitable for providing a desired environmental condition for a testing a semiconductor device includes a vortex tube and a semiconductor testing device suitable for testing at least one function of a semiconductor. The vortex tube includes an air inlet for receiving compressed air, a first air exhaust for outputting an air stream having a temperature greater than the received compressed air, and a second air exhaust for outputting an air stream having a temperature lower than the received compressed air. The semiconductor testing device is connected to the second air exhaust of the vortex tube so that the semiconductor testing device receives a cooled air stream from the vortex tube, the cooled air stream cooling a semiconductor device to a desired testing temperature enabling the semiconductor testing device to perform the test of the at least function of the semiconductor device at the desired temperature.

In a third aspect of the present invention, a vortex unit suitable for providing a desired environmental condition for testing a semiconductor includes a means for providing a vortex and a means for testing a semiconductor device. The vortex means includes an air inlet for receiving compressed air, a first air exhaust for outputting an air stream having a temperature greater than the received compressed air, and a second air exhaust for outputting an air stream having a temperature lower than the received compressed air. The semiconductor testing means is connected to the second air exhaust of the vortex means so that the semiconductor testing means receives a cooled air stream from the vortex means, the cooled air stream providing an environment suitable for enabling the semiconductor testing means to perform a semiconductor testing function.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
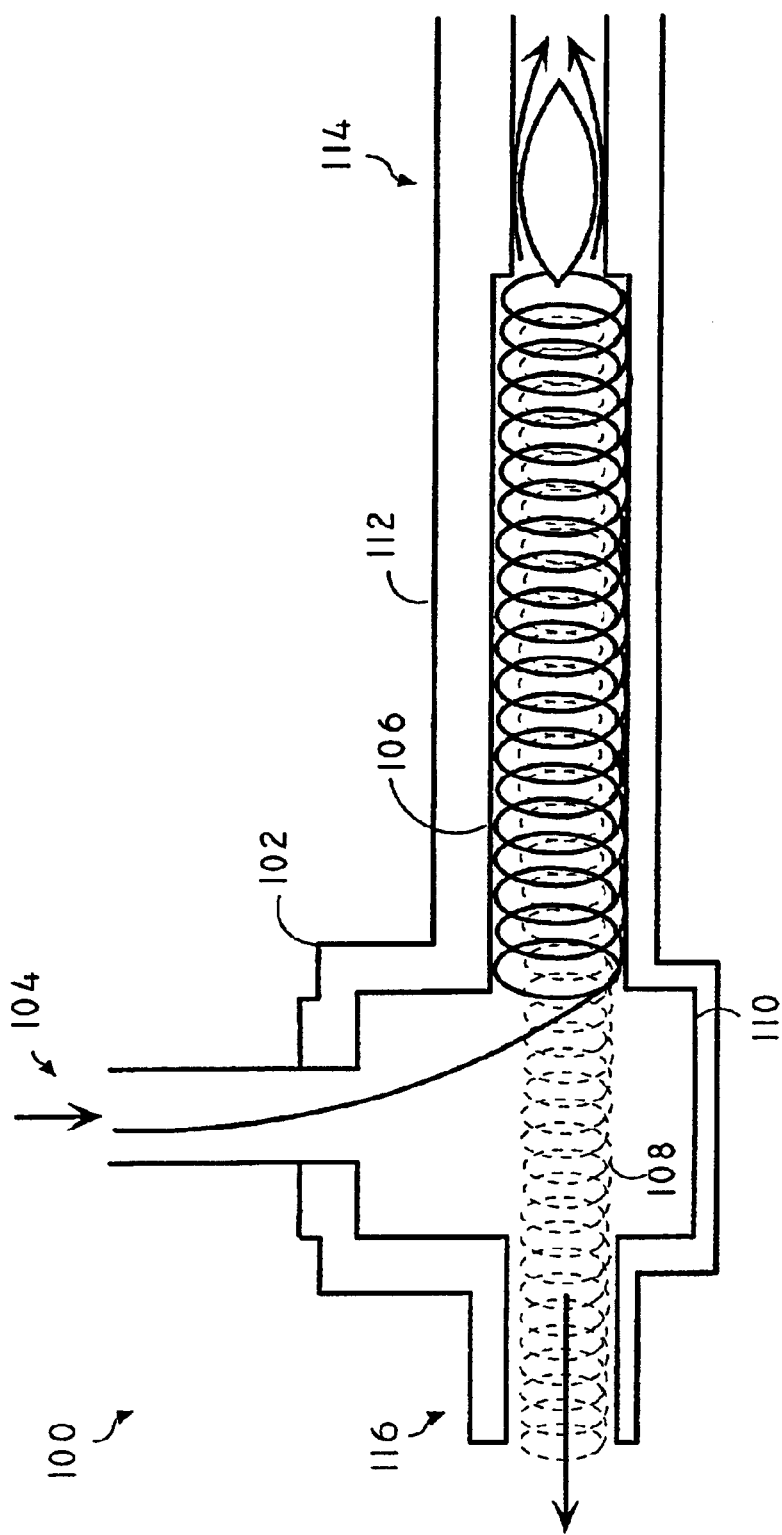
FIG. 1 is an illustration of an embodiment of the present invention in which function of a vortex tube suitable for being employed by the present invention is shown.
Figure 2:
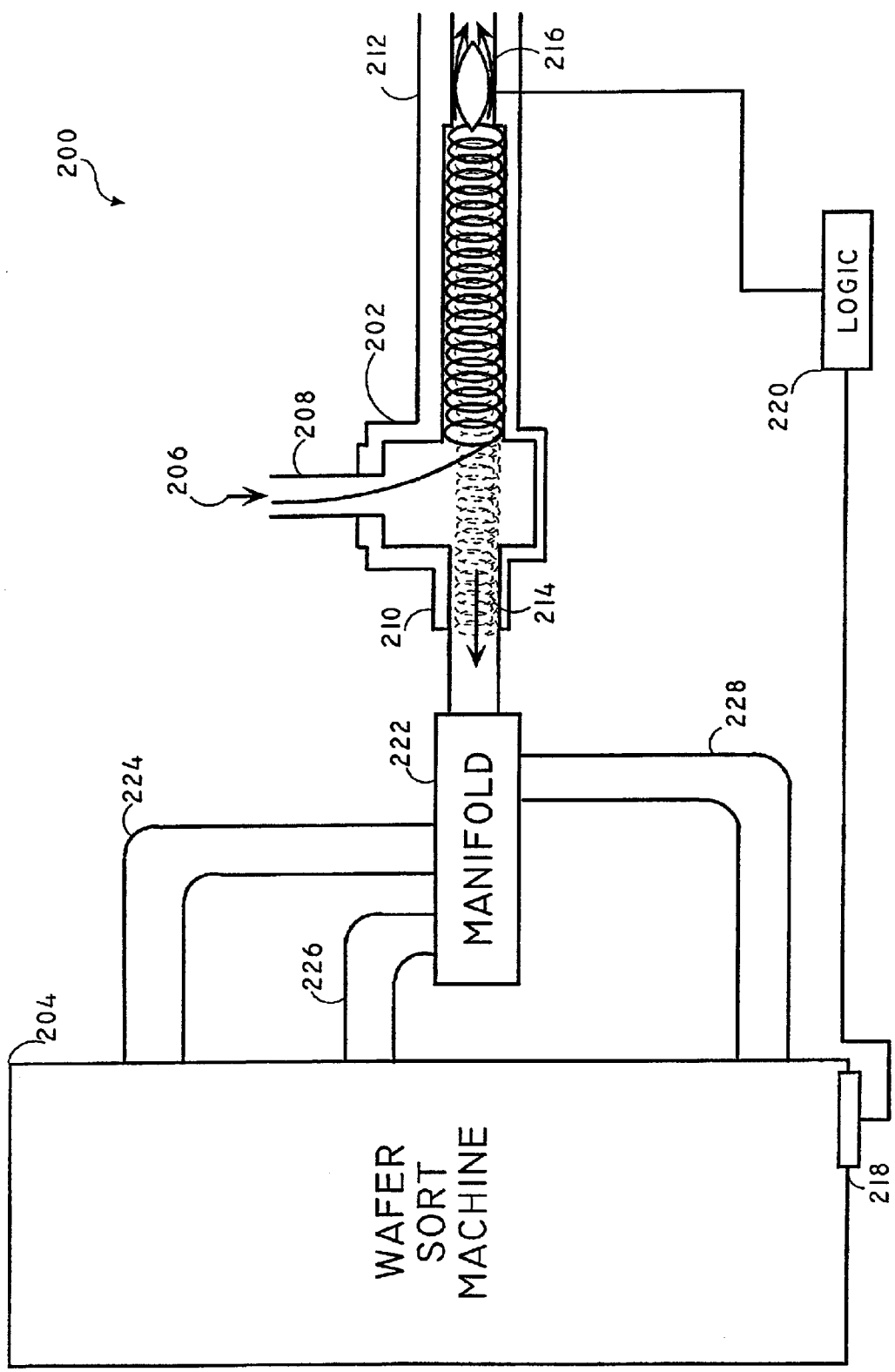
FIG. 2 is an illustration of an embodiment of the present invention in which an exemplary vortex unit utilized in conjunction with a semiconductor processing device is shown.

Referring generally now to FIGS. 1 through 2, exemplary embodiments of the present invention are shown. Generation of electromagnetic interference, system cost and size of the units were problems typically encountered through the use of previous environmental systems in semiconductor processes. For instance, liquid cooled environmental units are expensive, may cost several tens of thousands of dollars each, may utilize environmentally undesirable CFCs, and are large in size. Thus, the unit may require a large space in a manufacturing facility and may be expensive to maintain, due to a large quantity of complex parts. Further, the units may generate electromagnetic interference that may hamper operation of testing equipment, thereby requiring extensive shielding to ensure accurate test results. The present invention provides a desired environment for the testing and/or manufacture of semiconductor devices in an efficient and cost-effective manner without encountering electromagnetic interference that limited the implementation of previous environmental systems.

Referring now to FIG. 1, an embodiment 100 of the present invention is shown wherein a vortex tube suitable for cooling in accordance with the present invention is shown. A vortex tube 102 receives a stream of compressed air 104 and separates the stream into two air streams 106 & 108, a hot air stream and a cool air stream. The compressed air 104 enters a cylindrical generator 110 that is proportionally larger than a connected long tube 112. The cylindrical generator 110 causes the air to rotate as a first air stream 106. The rotating air 106 is forced down the end of the tube 112 against the inner walls of the tube 112. A portion of the first air stream 106 exits the tube 112, preferably through a valve 114, and is exhausted as hot air.

The remaining air returns through the center of the first air stream 106 as a second air stream 108, the second air stream 108 moving in the opposite direction slower that the first air stream 106. Heat in the second air stream 108 is transferred to the faster moving first air stream 106, which cools the second air stream 108. The second cooled air stream 108, after passing through the center of the cylindrical generator 110, exits through an exhaust port 116 as cooled air.

Thus, the vortex tube 102 creates two types of vortices, a free vortex, wherein the angular velocity of a fluid particle increases when moved toward the center of the vortex, and a forced vortex, wherein the velocity is directly proportion to the radius of the vortex, wherein the center of the vortex of the forced vortex has a slower velocity. In relation to the present figure, FIG. 1, the first air stream 106, or hot outer air stream is a free vortex and the second sir stream 108, or cold air stream is a forced vortex. The second air stream 108 flows inside the first air stream 110 at a velocity that is lower that the first air stream 110.

Since energy of the air streams is proportional to the square of the velocity, and the first air stream 106 and the second air stream 108 are coupled via turbulence as a single rotational mass, the second air stream loses resultant energy by heat transfer to the first air stream 106. In other words, the energy from the second air stream 108 is transferred to the first air stream 106 as heat, thereby cooling the second air stream 108. By utilizing this effect, a cooling apparatus may be provided that does not use refrigerants, does not require moving parts, thereby improving reliability, and does not require electricity, thereby limiting radio frequency interference in the manufacturing and testing process.

Referring now to FIG. 2, an embodiment 200 of the present invention is shown wherein a vortex system is utilized in a semiconductor testing process. A vortex tube 202 may be connected to a semiconductor-processing machine, such as a tester, assembler, and the like to provide a desired environment.

In this example, the vortex tube 202 is connected to a wafer sort and testing machine 204 to provide a desired environment for testing wafers. House compressed air 206, such as that supplied in a manufacturing facility for powering tools and the like, is connected to an "in" port 208 of the vortex tube 202. The vortex tube 202 has three orifices, compressed air in 208, cooled air exhaust 210 and hot air exhaust 212. An exhaust tube, such as a high temperature Teflon tube, may be connected to the hot air exhaust 212 and run to a lower compartment of a machine cabinet, such as a wafer sort machine 204, to direct hot air away from the desired area, such as a platen area of the machine.

The percentage of total input air volume 206 released through the cooled air exhaust 210 of the vortex tube 202 is called the Cold Fraction. Generally, the less cooled air 214 released, the colder the air. The cold fraction may be a function of how the vortex generator is configured, such as by utilizing a "high cold fraction" or "low cold fraction" generator, as described in FIG. 1. For instance, the vortex generator may be configured as desired to alter airflow and temperature ranges produced by the vortex tube 202 as contemplated by a person of ordinary skill in the art.

Additionally, a valve 216 located in the hot air exhaust of the vortex tube may be used to control the cold fraction. For example, as previously stated, the lower the amount of released air 214, the cooler the air. Thus, by using a valve 216 controllable by a user, the vortex tube 202 may supply a variety of atmospheres as desired by a user. Further, it may be preferable to control the valve and/or air input 206 by utilizing a temperature sensor 218 disposed in the desired apparatus, such as the wafer sort machine 204, operably linked to the valve 216 to enable the valve 216 and/or air supply 206 to be controlled automatically, such as through the use of a logic device 220, and the like as contemplated by a person of ordinary skill in the art.

In this instance, a cooled air stream 214 from the vortex tube 202 is directed through a manifold 222. The manifold 222 is connected to a plurality of tubes 224, 226 & 228, in this instance three poly tubes having ¼" inside diameter, ⅜" outside diameter. The tubes 224, 226 & 228 preferable duct the cooled air through three equal size holes in a side panel of a cabinet of the semiconductor-processing machine.

In additional contemplated embodiments, the size of the ducts, configuration of the manifold, size of the entry holes, position of the entry holes on the device, and the like are configured to provide a desired environmental result as contemplated by a person of ordinary skill in the art. For example, cooled air may be directed to the platen area of a prober in order to effectively cool a wafer for testing. In this way, a wafer may be tested at a desired temperature range, such as at approximately 25 degrees Celsius, 20 to 30 degrees Celsius, below 30 degrees Celsius, and like temperature ranges without departing from the spirit and scope of the present invention. For instance, by cooling a probe to 25 degrees for testing purposes, cooling parts of a wafer for testing, cooling the environment around the wafer, and the like, the noise table may be lowered, thereby enabling more precise measurements. In other contemplated embodiments, an additional manifold may be provided linking the cold air exhaust 210 and the host air exhaust 212 ports to provide a range of hot and cold temperature in a device, such as a testing device without departing from the spirit and scope of the present invention.

The vortex tube 202 may be mounted in an enclosure and encapsulated in insulating material, such as expanding insulating foam, to eliminate freezing condensation on the cooled end 210 of the vortex tube 202. In contemplated manufacturing of a vortex unit of the present invention, a unit may be produced for approximately $350, versus previous liquid cooled temperature controlled units that cost in the range of $24,000 to $38,000. Thus, a vortex unit of the present invention may fulfill a long-felt need in the semiconductor industry to provide an inexpensive cooling unit, which does not cause electromagnetic interference, is reliable because it does not require moving parts, and is capable of being utilized in a small space, thereby decreasing the space needed in a manufacturing facility.

It is believed that the vortex unit of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A vortex unit suitable for providing a desired environment for a semiconductor process, comprising:

a vortex tube having an air inlet for receiving compressed air, a first air exhaust for outputting an air stream having a temperature greater than the received compressed air, and a second air exhaust for outputting an air stream having a temperature lower than the received compressed air;

a semiconductor processing device suitable for performing a semiconductor processing function, wherein the semiconductor processing device is connected to the second air exhaust of the vortex tube so that the semiconductor processing device receives a cooled air stream from the vortex tube, the cooled air stream providing an environment suitable for enabling the semiconductor processing device to perform the semiconductor processing function while being exposed to the desired environment; and a manifold disposed between the vortex tube and the semiconductor processing device, wherein the manifold is operably connected to the second air exhaust of the vortex tube, and includes a plurality of tubes for dusting air received by the manifold to more than one location on the semiconductor processing device.

2. The vortex unit as described in claim 1, wherein the environment is approximately 25 degrees Celsius.

3. The vortex unit as described in claim 1, wherein the semiconductor processing device includes a testing device for testing operation of a semiconductor.

4. The vortex unit as described in claim 3, wherein the semiconductor is a wafer.

5. The vortex unit as described in claim 1, wherein the cooled air stream is directed to a platen area of a prober of the semiconductor processing device.

6. The vortex unit as described in claim 1, wherein the cooled air stream is directed to a chuck top of a prober.

7. The vortex unit as described in claim 6, wherein a wafer to be tested by the prober is cooled by the cooled prober.

8. The vortex unit as described in claim 1, wherein the first air exhaust is ducted so as not to interfere with the semiconductor processing device.

9. A vortex unit suitable for providing a desired environment for a testing a semiconductor device, comprising:

a vortex tube having an air inlet for receiving compressed air, a first air exhaust for outputting an air stream having a temperature greater than the received compressed air, and a second air exhaust for outputting an air stream having a temperature lower than the received compressed air;

a semiconductor testing device suitable for testing at least one function of a semiconductor device, wherein the semiconductor testing device is connected to the second air exhaust of the vortex tube so that the semiconductor testing device receives a cooled air stream from the vortex tube, the cooled air stream cooling a semiconductor device to a desired testing temperature enabling the semiconductor testing device to test the at least one function of the semiconductor device at the desired temperature; and a manifold disposed between the vortex tube and the semiconductor testing device, wherein the manifold is operably connected to the second air exhaust of the vortex tube, and includes a plurality of tubes for ducting air received by the manifold to more than one location on the semiconductor testing device.

10. The vortex unit as described in claim 9, wherein the temperature is approximately 25 degrees Celsius.

11. The vortex unit as described in claim 9, wherein the semiconductor is a wafer.

12. The vortex unit as described in claim 9, wherein the cooled air stream is directed to a platen area of a prober of the semiconductor testing device.

13. The vortex unit as described in claim 9, wherein the cooled air stream is directed to a chuck top of a prober.

14. The vortex unit as described in claim 13, wherein a wafer to be tested by the prober is cooled by the cooled prober.

15. A vortex unit suitable for providing a desired environment for testing a semiconductor, comprising:

a means for providing a vortex having an air inlet for receiving compressed air, a first air exhaust for outputting an air stream having a temperature greater than the received compressed air, and a second air exhaust for outputting an air stream having a temperature lower than the received compressed air;

a means for testing a semiconductor device, wherein the semiconductor testing means is connected to the second air exhaust of the vortex means so that the semiconductor testing means receives a cooled air stream from the vortex means, the cooled air stream providing an environment suitable for enabling the semiconductor testing means to perform a semiconductor testing function; and a manifold disposed between the vortex means and the semiconductor testing means, wherein the manifold is operably connected to the second air exhaust of the vortex means, and includes a plurality of tubes for ducting air received by the manifold to more than one location on the semiconductor testing means.

16. The vortex unit as described in claim 15, wherein the cooled air stream is directed to a platen area of a means for probing of the semiconductor testing means.

17. The vortex unit as described in claim 15, wherein the cooled air stream is directed to a chuck top of the probing means.

18. A semiconductor processing apparatus suitable for providing a desired environment for a semiconductor process, comprising:

a vortex tube having an air inlet for receiving compressed air, a first air exhaust for outputting an air stream having a temperature greater than the received compressed air, and a second air exhaust for outputting an air stream having a temperature lower than the received compressed air;

a semiconductor processing device suitable for performing a semiconductor processing function, wherein the semiconductor processing device is connected to the second air exhaust of the vortex tube so that the semiconductor processing device receives a cooled air stream from the vortex tube, the cooled air stream providing an environment suitable for enabling the semiconductor processing device to perform the semiconductor processing function while being exposed to the desired environment; and a manifold disposed between the vortex tube and the semiconductor processing device, wherein the manifold is operably connected to the second air exhaust of the vortex tube, and includes a plurality of tubes for ducting air received by the manifold to more than one location on the semiconductor processing device.

19. The semiconductor processing apparatus of claim 18, wherein the semiconductor processing device is a wafer sort machine.

20. The semiconductor processing apparatus of claim 18, wherein the manifold aforementioned is a first manifold, further comprising a second manifold linking the first and second air exhausts to provide a range of hot and cold temperature in the semiconductor processing device.

21. A semiconductor testing apparatus suitable for providing a desired environment for a testing a semiconductor device, comprising:

a vortex tube having an air inlet for receiving compressed air, a first air exhaust for outputting an air stream having a temperature greater than the received compressed air, and a second air exhaust for outputting an air stream having a temperature lower than the received compressed air;

a semiconductor testing device suitable for testing at least one function of a semiconductor device, wherein the semiconductor testing device is connected to the second air exhaust of the vortex tube so that the semiconductor testing device receives a cooled air stream from the vortex tube, the cooled air stream cooling a semiconductor device to a desired testing temperature enabling the semiconductor testing device to test at least one function of the semiconductor device at the desired temperature; and a manifold disposed between the vortex tube and the semiconductor processing device, wherein the manifold is operably connected to the second air exhaust of the vortex tube, and includes a plurality of tubes for ducting air received by the manifold to more than one location on the semiconductor testing device.

22. The semiconductor testing apparatus of claim 21, wherein the aforementioned is a first manifold, further comprising a second manifold linking the first and second air exhausts to provide a range of hot and cold temperature in the semiconductor testing device.

* * * * *